(12) United States Patent
Regan et al.

(10) Patent No.: US 8,558,281 B1
(45) Date of Patent: Oct. 15, 2013

(54) GATE METALLIZATION METHODS FOR SELF-ALIGNED SIDEWALL GATE GAN HEMT

(75) Inventors: Dean C. Regan, Moorpark, CA (US); Keisuke Shinohara, Thousand Oaks, CA (US); Andrea Corrion, Oak Park, CA (US); Ivan Milosavljevic, Thousand Oaks, CA (US); Miroslav Micovic, Thousand Oaks, CA (US); Peter J. Willadsen, Acton, CA (US); Colleen M. Butler, Camarillo, CA (US); Hector L. Bracamontes, Lawndale, CA (US); Bruce T. Holden, Torrance, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/310,473

(22) Filed: Dec. 2, 2011

(51) Int. Cl.
*H01L 29/205* (2006.01)

(52) U.S. Cl.
USPC .... 257/194; 438/167; 438/172; 257/E21.403; 257/E21.407; 257/E29.246

(58) Field of Classification Search
USPC .............. 438/79, 180–183, 167, 172; 257/24, 257/192, 288, 412, E29.069, E29.089, 76, 257/194, E29.246, E21.403, E21.407
See application file for complete search history.

(56) References Cited

U.S. PATENT DOCUMENTS

| | | | | |
|---|---|---|---|---|
| 5,929,467 A * | 7/1999 | Kawai et al. | .................. | 257/192 |
| 6,515,320 B1 * | 2/2003 | Azuma et al. | .................. | 257/288 |
| 8,383,471 B1 * | 2/2013 | Shinihara et al. | ............. | 438/167 |
| 2013/0119400 A1 * | 5/2013 | Shinohara et al. | .............. | 257/76 |

OTHER PUBLICATIONS

M. Micovic, et al., "GaN HFET for W-band Power Applications", Electron Devices Meeting IEDM p. 1-3 (20060.

* cited by examiner

*Primary Examiner* — Ermias Woldegeorgis
(74) *Attorney, Agent, or Firm* — Ladas & Parry

(57) ABSTRACT

A method for fabricating a gate structure for a field effect transistor having a buffer layer on a substrate, a channel layer and a barrier layer over the channel layer includes forming a gate including silicon, forming first sidewalls of a first material on either side and adjacent to the gate, selectively etching into the buffer layer to form a mesa for the field effect transistor, depositing a material layer over the mesa, planarizing the material layer over the mesa to form a planarized surface such that a top of the gate, tops of the first sidewalls, and a top of the material layer over the mesa are on the same planarized surface, depositing metal on the planzarized surface, annealing to form the gate into a metal silicided gate, and etching to remove excess non-silicided metal.

10 Claims, 3 Drawing Sheets

GATE METALLIZATION METHODS FOR SELF-ALIGNED SIDEWALL GATE GAN HEMT

STATEMENT REGARDING FEDERAL FUNDING

This invention was made under U.S. Government contract HR0011-09-C-0126. The U.S. Government has certain rights in this invention.

CROSS REFERENCE TO RELATED APPLICATIONS

None

TECHNICAL FIELD

This disclosure relates to gate formation for field effect transistors, and in particular to formation of gates with high aspect ratios.

BACKGROUND

Next-generation gallium nitride (GaN) high electron mobility transistors (HEMTs) require aggressive scaling of device dimensions to reduce device delays, access resistances, and parasitic capacitances for improved high-frequency performance. In particular, ultra-short nanometer-scale gate length and source-drain spacing are required. Also needed is a robust, high throughput, reproducible, and reliable process for such small geometries. Conventionally, high-frequency GaN HEMTs are fabricated using e-beam lithography, metal evaporation and lift-off for T-shaped gate formation. However, using the conventional fabrication processes, the aspect ratio h/Lg defined by the ratio of height (h) 11 of the gate and length 13 of the gate foot (Lg), as shown in height of FIG. 1B, is limited, which decreases the gate head-to-channel distance, giving rise to parasitic capacitances. Furthermore, device uniformity, yield, and minimum gate length relies on alignment accuracy and resolution of e-beam lithography tools, limiting minimum dimensions of scaled devices.

The aspect ratio of conventional T-shaped gates is limited to less than three (3) due to process limitations of the conventional processes.

What is needed is a reliable process for the metallization of high aspect ratio gates in order to increase the performance of field effect transistors and in particular GaN HEMTs. The embodiments of the present disclosure answer these and other needs.

SUMMARY

In a first embodiment disclosed herein, a method for fabricating a gate structure for a field effect transistor having a buffer layer on a substrate, a channel layer over the buffer layer and a barrier layer over the channel layer comprises forming a gate, the gate comprising silicon, forming first sidewalls on either side and adjacent to the gate, the first sidewalls comprising a first material, selectively etching into the buffer layer to form a mesa for the field effect transistor, depositing a material layer over the mesa, planarizing the material layer over the mesa to form a planarized surface such that a top of the gate, tops of the first sidewalls, and a top of the material layer over the mesa are on the same planarized surface, depositing metal on the planarized surface, annealing to form the gate into a metal silicided gate, and selectively etching to remove excess non-silicided metal.

In another embodiment disclosed herein, a method for fabricating a gate structure for a field effect transistor having a buffer layer on a substrate, a channel layer over the buffer layer and a barrier layer over the channel layer comprises forming a gate, the gate comprising a first dielectric, forming first sidewalls on either side and adjacent to the gate, the first sidewalls comprising a second dielectric, selectively etching into the buffer layer to form a mesa for the field effect transistor, depositing a dielectric layer over the mesa, planarizing the dielectric layer over the mesa to form a planarized surface such that a top of the gate, tops of the first sidewalls, and a top of the dielectric layer over the mesa are on the same planarized surface, selectively etching and removing the gate to form a vacated region, and depositing metal in the vacated region by ALD to form a metal gate, or plating metal in the vacated region by using current flowing through the barrier layer to the channel layer to form a metal gate.

In yet another embodiment disclosed herein, a field effect transistor having a substrate, a channel layer, and a barrier layer comprises a gate on the barrier layer, the gate having an aspect ratio of a height of the gate to a length of a foot of the gate equal to or greater than 5, a first sidewall on one side of the gate and adjacent to the gate, and a second sidewall on another side of the gate and adjacent to the gate.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figures 1A, 1B:
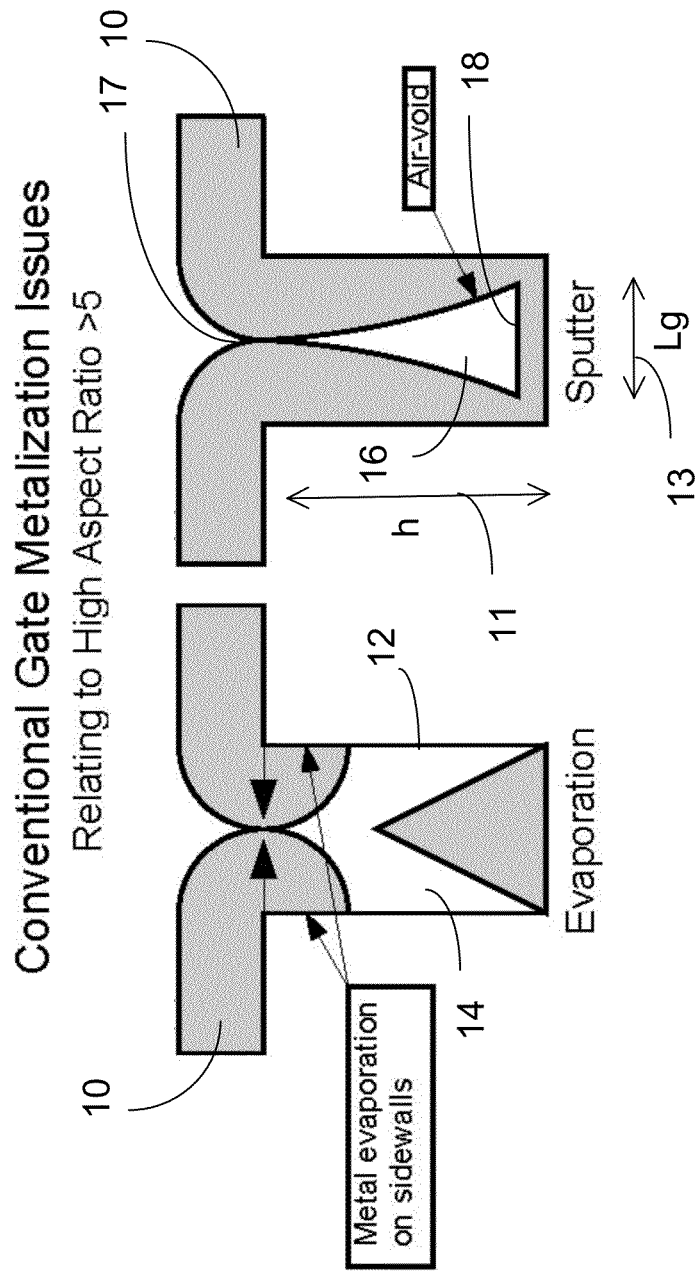
FIGS. 1A and 1B show the limitations of the conventional processes for fabrication in accordance with the prior art.

Conventionally, the fabrication process for GaN HEMTs uses e-beam lithography for gate foot/head definition followed by metal evaporation and lift-off. To achieve high performance, a high aspect ratio of the gate height to gate foot length (h/Lg) is required, and high aspect ratios greater than 5 are desirable. However, the use of conventional evaporation and sputter metallization fabrication techniques for high aspect ratio gates may result in evaporation of gate metal 10 from the gate sidewalls 12, as shown by evaporated region 14, shown in FIG. 1A. FIG. 1A shows that the top opening size shrinks and closes with increasing evaporation thickness, which may result in disconnected gate features, and low process yield.

FIG. 1B shows a similar issue which may occur during metal sputtering. Metal deposition at the top opening 17 grows faster than at the bottom of the opening 18, which may result in an air-void 16 in the gate structure, which increases gate resistance, limits device performance, limits uniformity and reduces process yield.

Figure 2:
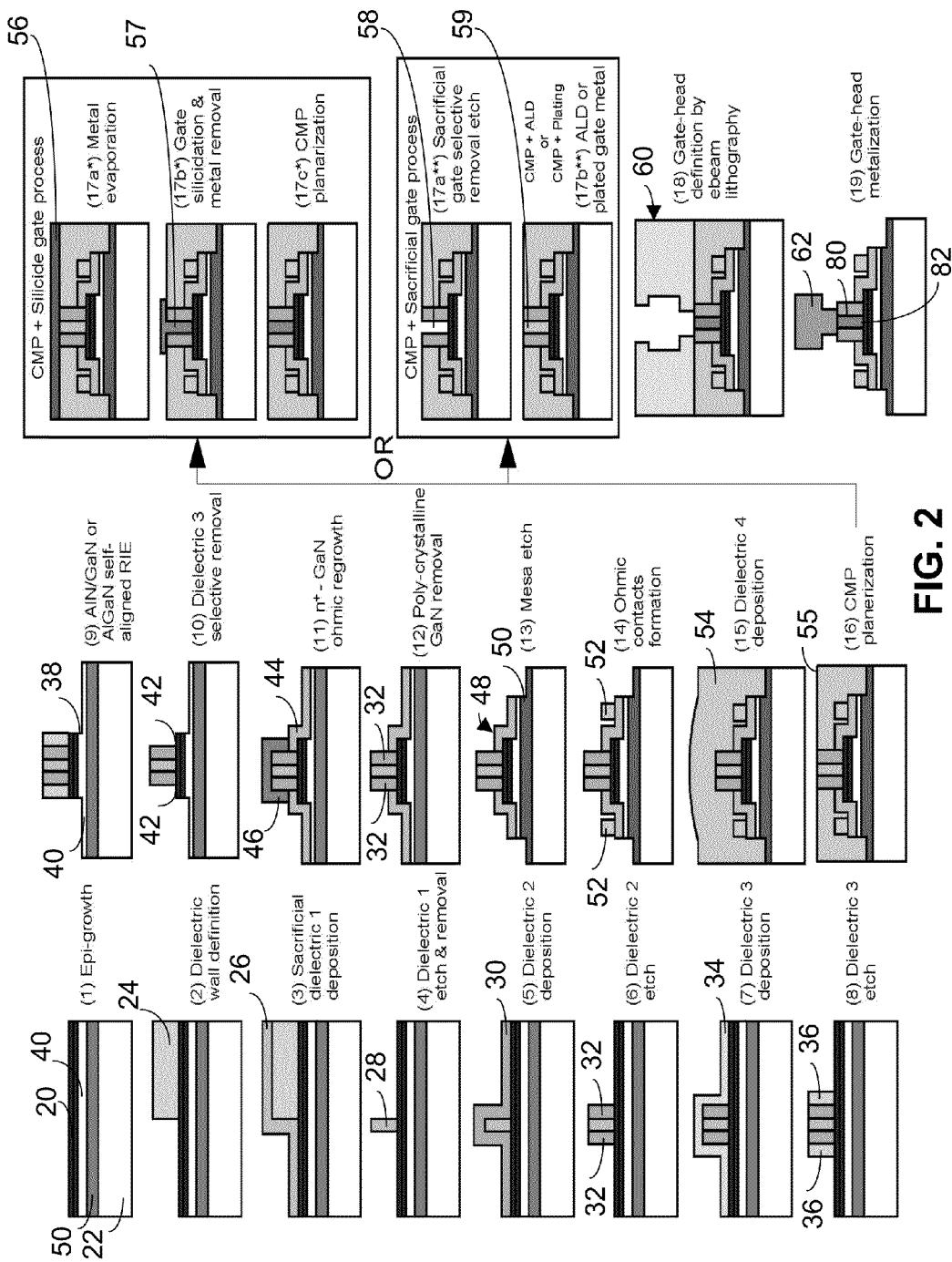
FIG. 2 shows a flow diagram of a self-aligned sidewall gate fabrication process in accordance with the present disclosure.

FIG. 2 shows a flow diagram of a self-aligned sidewall gate fabrication process for a GaN HEMT in accordance with the present disclosure. A HEMT fabricated according to the principles of the present invention may have a gate having an h/Lg aspect ratio greater than or equal to 5. The fabrication steps are as follows.

As shown in FIG. 2, step 1, epitaxial growth of a GaN HEMT structure is performed on a suitable substrate 22, such as sapphire, SiC, silicon, GaN, etc. The GaN HEMT structure may include a buffer layer 50, a channel layer 40 and a barrier layer 20, which may be a Schottky epitaxial layer. Optionally a high-k gate dielectric layer, such as $Al_2O_3$, $HfO_2$, $TiO_2$, etc, may be deposited on the barrier layer 20 using a deposition technique such as, atomic layer deposition (ALD), etc, to reduce gate leakage and protect the epitaxial structure from being damaged during subsequent processing steps.

Then as shown in FIG. 2, step 2 dielectric wall definition is performed via photo or e-beam lithography by depositing a sacrificial layer 24 on the barrier layer 20.

Then as shown in step 3a first material layer 26 such as Si, $SiO_2$, SiN, SiON, $Al_2O_3$, $HfO_2$, ZrO, $TiO_2$ is deposited over the sacrificial layer 24 and the barrier layer 20 using deposition techniques such as chemical vapor deposition (CVD) or ALD.

Next in step 4, the first material layer 26 and the sacrificial layer 24 are dry plasma etched using a reactive ion etching (RIE) technique, or inductively-coupled plasma reactive ion etching (ICP-RIE) technique, etc., to define the gate placeholder 28.

Then in step 5 a second material layer 30 such as Si, SiON, $HfO_2$, ZrO, or $TiO_2$ is deposited over the gate placeholder 28 and the barrier layer 20 using a deposition technique such as CVD, sputtering, ALD, etc, to the desired thickness for first gate sidewall spacers 32.

Next in step 6, the second material layer 30 is dry plasma etched using RIE, or ICP-RIE, etc., to form the first gate sidewall spacers 32 on either side and adjacent to gate placeholder 28.

Then in step 7, a third material layer 34 such as Si, SiON, $HfO_2$, ZrO, $TiO_2$, is deposited over the gate placeholder 28, the first gate sidewall spacers 32, and the barrier layer 20 using a deposition technique such as CVD, sputtering, ALD, etc, to the desired thickness for second sidewall spacers 36. This film thickness defines the dimension of the self-aligned n+ ledge during ohmic regrowth, which reduces access resistance by increasing the channel charge under the ledge and improving contact to the 2 DEG.

Then in step 8 the third material layer 34 is dry plasma etched using RIE, or ICP-RIE, etc., to form the second sidewall spacers 36 on either side of the first gate sidewall spacers 32.

Next in step 9 the barrier layer 20 is selectively dry plasma etched using RIE/ICP-RIE, etc. with a recess 38 into a channel layer 40 in order to allow contact between a two dimensional electron gas (2 DEG) and subsequent regrown n+ contacts. Examples of combinations of Schottky barrier layer 20 and channel layers 40 include AlGaN for the Schottky barrier layer 20 and InGaN or GaN for the channel layer 40, and InAlN for the Schottky barrier layer 20 and InGaN or GaN for the channel layer 40.

Then in step 10 the second sidewall spacers 36 are selectively wet etched and removed to form a self-aligned n+ ledge 42 for subsequent ohmic regrowth.

Next in step 11, n+ material 44 for ohmic contacts, such as n+GaN, n+InN, n+InGaN, are selectively regrown by MBE or MOCVD. Defective (polycrystalline) regrown material 46 also forms in this step.

Then in step 12, the defective (polycrystalline) regrown material 46 is selectively wet etched and removed from the first gate sidewall spacers 32 and the gate placeholder 28.

Next in step 13, a mesa 48 is isolated and defined by photolithography and dry plasma etching such as RIE/ICP-RIE of epitaxial layer structures with a recess into the buffer layer 50.

Then in step 14, ohmic contacts 52 for a source and drain are defined via photolithography and metallization via evaporation deposition.

Next in step 15, a fourth material layer 54 such as Si, SiON, $HFO_2$, ZrO, $TiO_2$, is deposited over the mesa 48 and the ohmic contacts 52 using a deposition technique such as CVD, sputtering, ALD, etc, to the desired thickness for planarization.

Then in step 16, chemical mechanical polishing (CMP) of the fourth material layer 54 is performed to planarize the fourth material layer 54 with the first double sidewall spacers 32 and the gate placeholder 28, creating planarized surface 55.

Then in step 17, as illustrated by the CMP+ silicide gate process block in FIG. 2, gate metal 56 is deposited over the planarized surface 55. Then the structure is annealed to transform a gate placeholder 28 formed of silicon into a metal silicided gate 57. Then selective wet etching is performed to remove excess non-reacted metal. A second CMP process may be performed to planarize and clean the gate interface.

Alternatively, in step 17, as illustrated by the CMP+ sacrificial gate process block in FIG. 2, the gate placeholder 28 formed of the first material layer 26 may be selectively etched and removed. Then gate metal 59 may be deposited in the vacant region by ALD, or the gate metal 59 may be plated by using current flowing through the barrier layer to the channel layer, which enables complete gate metallization from the epitaxial structure upward ensuring a low resistance gate 59. A second CMP process may be performed to planarize and clean the gate interface.

Next in step 18, electron beam lithography may be used to define a traditional T gate head design 60. The lithography is well controlled due to the planarized surface 55.

Finally in step 19, a metal gate head 62 is metallized using electroplating or evaporation deposition to form the completed gate structure.

According to the methods described above the aspect ratio h/Lg (height/length of the gate foot) of the silicided gate 57 or the metal gate 59 may be made to have an h/Lg of greater than or equal to 5, where h is the height of side 80 and Lg is the length of the gate foot 82.

Figure 3:
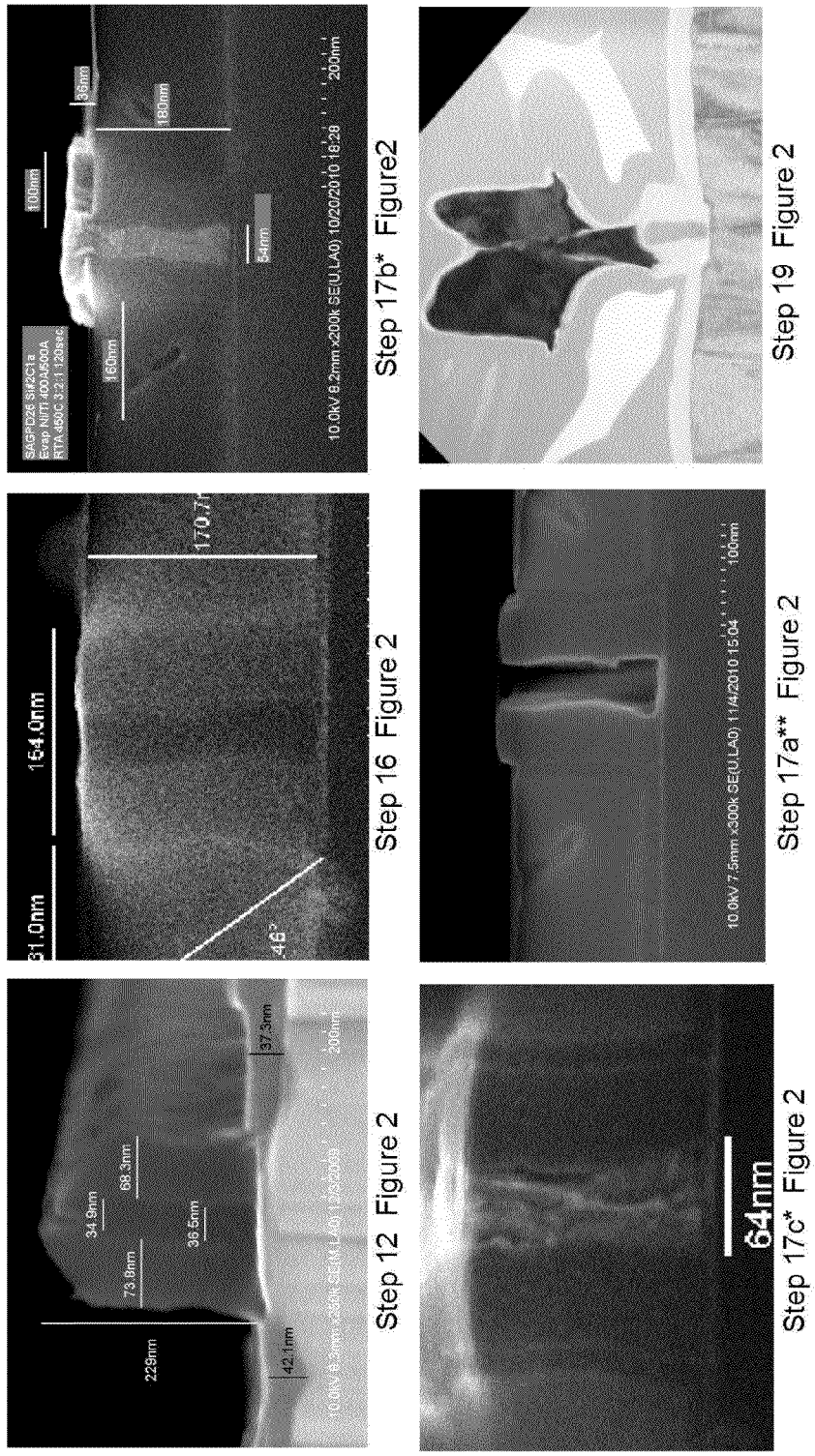
FIG. 3 shows scanning electron microscope (SEM) images of a demonstration of a self-aligned sidewall gate fabrication process in accordance with the present disclosure.

The SEM images shown in FIG. 3 demonstrate the feasibility of forming a high quality metalized gate of very short length with high aspect ratio. By using a CMP planarization process, a clean continuous interface makes it possible to form a metal silicided gate, or to remove a sacrificial placeholder gate 28 followed by a metalized ALD or plated gate 59 with low resistance.

FIG. 3 shows the sacrificial placeholder gate 28 with first gate sidewall spacers 32 and ohmic regrowth corresponding to step 12 of FIG. 2; the CMP planarization process, corresponding to step 16 of FIG. 2; silicided gate corresponding to step 17b in the CMP+silicide gate process block of FIG. 2;

CMP planarization after forming the silicided gate corresponding to step 17c in the CMP+silicide gate process block of FIG. 2; Si sacrificial gate removal, corresponding to inset 17a in the CMP+sacrificial gate process block of FIG. 2; and gate head metallization corresponding to step 19 of FIG. 2.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for fabricating a gate structure for a field effect transistor having a buffer layer on a substrate, a channel layer over the buffer layer and a barrier layer over the channel layer, the method comprising:
    forming a gate, the gate comprising silicon;
    forming first sidewalls on either side and adjacent to the gate, the first sidewalls comprising a first material;
    selectively etching into the buffer layer to form a mesa for the field effect transistor;
    depositing a material layer over the mesa;
    planarizing the material layer over the mesa to form a planarized surface such that a top of the gate, tops of the first sidewalls, and a top of the material layer over the mesa are on the same planarized surface;
    depositing metal on the planzarized surface;
    annealing to form the gate into a metal silicided gate; and
    selectively etching to remove excess non-silicided metal.

2. The method of claim 1 further comprising:
    forming second sidewalls on either side and adjacent to the first sidewalls, the second sidewall comprising a second material;
    selectively etching the barrier layer and the channel layer to form a recess into the channel layer on either side of the second sidewalls;
    removing the second sidewalls to form self-aligned ledges on the epitaxial layer adjacent the first sidewalls;
    forming an ohmic regrowth layer over the ledges and over the channel layer;
    selectively etching the ohmic regrowth layer and the channel layer to form the mesa for the field effect transistor; and
    forming ohmic contacts on the ohmic regrowth layer for source and drain contacts.

3. The method of claim 2 wherein the first material comprises Si, SiON, $HfO_2$, ZrO, or $TiO_2$.

4. The method of claim 2 wherein the second material comprises Si, SiON, $HfO_2$, ZrO, or $TiO_2$.

5. The method of claim 1 wherein:
    the barrier layer comprises AlGaN or InAlN; and
    the channel layer comprises InGaN or GaN.

6. The method of claim 1 wherein the material layer over the mesa comprises Si, SiON, $HFO_2$, ZrO, or TiO.

7. The method of claim 1 wherein planarizing the material layer over the mesa comprises chemical mechanical polishing (CMP).

8. The method of claim 1 wherein the step of selectively etching to remove excess non-silicided metal further comprises a second chemical mechanical polishing (CMP) process to planarize and clean a gate interface.

9. The method of claim 1 further comprising:
    electron beam lithography to define a gate head design on the planarized surface; and
    metallizing the gate head using electroplating or evaporation deposition.

10. The method of claim 1 wherein the metal silicided gate has an aspect ratio of a height of the metal silicided gate to a length of a foot of the metal silicided gate equal to or greater than 5.

* * * * *